(12) United States Patent
Kim et al.

(10) Patent No.: US 8,324,628 B2
(45) Date of Patent: Dec. 4, 2012

(54) CHANNEL LAYER FOR A THIN FILM TRANSISTOR, THIN FILM TRANSISTOR INCLUDING THE SAME, AND METHODS OF MANUFACTURING THE SAME

(75) Inventors: Sun-il Kim, Yongin-si (KR); I-hun Song, Seongnam-si (KR); Young-soo Park, Yongin-si (KR); Dong-hun Kang, Yongin-si (KR); Chang-jung Kim, Yongin-si (KR); Jae-chul Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 287 days.

(21) Appl. No.: 12/073,102

(22) Filed: Feb. 29, 2008

(65) Prior Publication Data
US 2009/0001432 A1 Jan. 1, 2009

(30) Foreign Application Priority Data
Jun. 27, 2007 (KR) .................. 10-2007-0063826

(51) Int. Cl.
 *H01L 29/04* (2006.01)
 *H01L 21/20* (2006.01)

(52) U.S. Cl. ....... 257/72; 257/59; 257/60; 257/E27.113; 257/E27.116; 438/149; 438/217; 438/478

(58) Field of Classification Search .............. 257/59, 257/60, 72, E27.113, E27.116; 438/149, 438/217, 478, 479
See application file for complete search history.

(56) References Cited

U.S. PATENT DOCUMENTS

| 6,563,174 | B2 | 5/2003 | Kawasaki et al. | |
|---|---|---|---|---|
| 2005/0017302 | A1* | 1/2005 | Hoffman | 257/347 |
| 2005/0062134 | A1* | 3/2005 | Ho et al. | 257/614 |
| 2007/0018163 | A1* | 1/2007 | Chiang et al. | 257/59 |

FOREIGN PATENT DOCUMENTS

| JP | 2004-103957 A | 4/2004 |
|---|---|---|
| JP | 2004-235180 A | 8/2004 |
| JP | 2002-076356 A | 3/2012 |

OTHER PUBLICATIONS

Office Action dated May 11, 2011 for corresponding Chinese Patent Application No. 200810088615.9 w/English translation.

* cited by examiner

*Primary Examiner* — Matthew E Warren
(74) *Attorney, Agent, or Firm* — Harness, Dickey & Pierce, P.L.C.

(57) ABSTRACT

Provided is a channel layer for a thin film transistor, a thin film transistor and methods of forming the same. A channel layer for a thin film transistor may include IZO (indium zinc oxide) doped with a transition metal. A thin film transistor may include a gate electrode and the channel layer formed on a substrate, a gate insulating layer formed between the gate electrode and channel layer, and a source electrode and a drain electrode which contact ends of the channel layer.

23 Claims, 8 Drawing Sheets

CHANNEL LAYER FOR A THIN FILM TRANSISTOR, THIN FILM TRANSISTOR INCLUDING THE SAME, AND METHODS OF MANUFACTURING THE SAME

PRIORITY STATEMENT

This application claims priority under 35 U.S.C. §119 to Korean Patent Application No. 10-2007-0063826, filed on Jun. 27, 2007, in the Korean Intellectual Property Office (KIPO), the entire contents of which are incorporated herein by reference.

BACKGROUND

1. Field

Example embodiments relate to a channel layer for a thin film transistor, a thin film transistor including the channel layer and methods of manufacturing the same.

2. Description of the Related Art

A thin film transistor may be used as a switching device or a driving device in flat panel display apparatuses, e.g., liquid crystal display apparatuses and/or organic light emitting display apparatuses. The carrier mobility or leakage current of the thin film transistor may be affected by the material for forming a channel layer, and the state of the channel layer which is a path for moving charge carriers.

In current liquid crystal display apparatuses, the channel layers of the thin film transistors may be mostly formed as an amorphous silicon layer, and as such, the carrier mobility of the thin film transistors may be relatively low (about 0.5 cm$^2$/Vs), and thereby, hardly increasing the operation speed of the liquid crystal display apparatuses.

Therefore, in the related art, a semiconductor oxide material layer having a carrier mobility higher than that of the amorphous silicon layer, for example, a ZnO based material layer, as the channel layer of the thin film transistor has been studied, because the carrier mobility of the ZnO based material layer is a few tens of times higher than that of the amorphous silicon layer.

SUMMARY

Example embodiments provide a channel layer formed of a material having a carrier mobility higher than that of an amorphous silicon layer, a thin film transistor including the channel layer and methods of manufacturing the same.

According to example embodiments, a channel layer for a thin film transistor may include IZO (indium zinc oxide) doped with a transition metal. The channel layer may be made of a material expressed as an equation of $a(In_2O_3) \cdot b(ZnO)$, where a and b are real numbers such that a>about 0 and b>about 0. The channel layer may be formed of a material expressed with an equation of $a(In_2O_3) \cdot b(ZnO)$, where a and b are real numbers such that about $0 < a \leq$ about 1 and $b \geq$ about 1. The transition metal may be at least one selected from the elements of Group IX to XI. The transition metal may be Ni or Cu. The doping concentration of the transition metal may be about $10^3$~about $10^{22}$ atom/cm$^3$.

According to example embodiments, a thin film transistor may include a gate electrode and the channel layer according to example embodiments on a substrate, a gate insulating layer between the gate electrode and channel layer, and a source electrode and a drain electrode which contact ends of the channel layer. The gate electrode may be above or below the channel layer. The thin film transistor may further include a passivation layer on the gate insulating layer and the gate electrode or the source and drain electrodes.

According to example embodiments, a method of forming a channel layer used in a thin film transistor may include providing a semiconductor material layer for forming a channel, and patterning the semiconductor material layer to form a channel layer, wherein the semiconductor material layer may be an IZO layer doped with a transition metal. The channel layer may be formed of a material expressed as an equation of $a(In_2O_3) \cdot b(ZnO)$, where a and b are real numbers such that a>about 0 and b>about 0. The channel layer may be formed of a material expressed with an equation of $a(In_2O_3) \cdot b(ZnO)$, where a and b are real numbers such that about $0 < a \leq$ about 1 and $b \geq$ about 1. The transition metal may be at least one selected from the elements of Group IX to XI. The transition metal may be Ni or Cu. The doping concentration of the transition metal may be about $10^3$~about $10^{22}$ atom/cm$^3$.

According to example embodiments, a method of manufacturing a thin film transistor may include forming the channel layer according to example embodiments on a substrate, forming a source electrode and a drain electrode on the channel layer, wherein the source electrode and drain electrode contact ends of the channel layer, forming a gate insulating layer on exposed portions of the channel layer and the source and drain electrode, and forming a gate electrode on the gate insulating layer. The method may further include forming a passivation layer on the gate electrode and the gate insulating layer.

According to example embodiments, a method of manufacturing a thin film transistor may include forming a gate electrode and a gate insulating layer on a substrate, forming the channel layer according to example embodiments on the gate insulating layer, and forming a source electrode and a drain electrode on the channel layer, wherein the source electrode and drain electrode contact ends of the channel layer. The method may further include forming a passivation layer to cover the source and drain electrodes on the gate insulating layer.

The use of example embodiments may realize a thin film transistor that includes a channel layer having increased carrier mobility.

BRIEF DESCRIPTION OF THE DRAWINGS

Example embodiments will be more clearly understood from the following detailed description taken in conjunction with the accompanying drawings. FIGS. 1-6 represent non-limiting, example embodiments as described herein.

FIGS. 1 and 2 are cross-sectional views of thin film transistors according to example embodiments;

FIG. 5 is a graph showing the characteristics of drain current $I_d$ according to gate voltage $V_g$ for each drain voltage $V_d$ of the thin film transistor of FIG. 2, according to example embodiments; and FIG. 6 is a graph showing the characteristics of drain current $I_d$ according to gate voltage $V_g$ for each drain voltage $V_d$ of a thin film transistor manufactured as a comparative example to compare with example embodiments.

Figure 1:
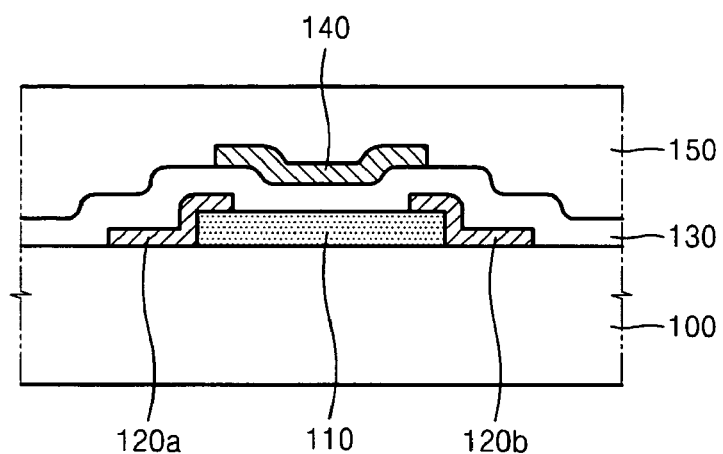

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings in which example embodiments are shown. Example embodiments may, however, be embodied in many different forms and should not be construed as being limited to the embodiments set forth herein. Rather, these embodiments are provided so that this disclosure will be thorough and complete, and will fully convey the scope of example embodiments to those skilled in the art. In the drawings, the thickness of layers, films and regions are exaggerated for clarity. Like numbers refer to like elements throughout the specification.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view of a thin film transistor according to example embodiments. The thin film transistor may have a top gate structure in which a gate electrode 140 is formed on a channel layer 110. Referring to FIG. 1, the channel layer 110 may be formed on a substrate 100. The substrate 100 may be a silicon substrate, a glass substrate, or a plastic substrate, and may be transparent or non-transparent. A source electrode 120a and a drain electrode 120b may be formed on the substrate 100 to contact ends of the channel layer 110, and the source electrode 120a and the drain electrode 120b may be a single metal layer or a multiple metal layer. A gate insulating layer 130 covering or on the channel layer 110, the source electrode 120a, and the drain electrode 120b may be formed on the substrate 100. The gate electrode 140 may be formed on the gate insulating layer 130, and may be located above the channel layer 110. The gate electrode 140 may be formed of the same or a different material as the source electrode 120a. A passivation layer 150 covering or on the gate electrode 140 may be formed on the gate insulating layer 130. The gate insulating layer 130 and the passivation layer 150 may be a silicon oxide layer or a silicon nitride layer.

The channel layer 110, the source electrode 120a, the drain electrode 120b, the gate insulating layer 130, and the gate electrode 140, may have a thickness of about 30 nm~about 200 nm, about 10 nm~about 200 nm, about 10 nm~about 200 nm, about 50 nm~about 300 nm, and about 50 nm~about 300 nm, respectively.

The channel layer 110 may be an indium zinc oxide (IZO) layer in which a transition metal is doped, and the IZO layer may be an $a(In_2O_3) \cdot b(ZnO)$ layer, where a and b are real numbers such that a>about 0 and b>about 0, and may be real numbers such that about $0 < a \leqq$ about 1 and $b \geqq$ about 1. The transition metal doped into the channel layer 110 may be at least one selected from the Group IX to XI elements (Co, Rh, Ir, Mt, Ni, Pd, Pt, Ds, Cu, Ag, Au and/or Rg). For example, the transition metal doped into the channel layer 110 may be Ni or Cu, and the doping concentration of the transition metal may be about $10^3$ to about $10^{22}$ atom/cm$^3$.

Figure 2:
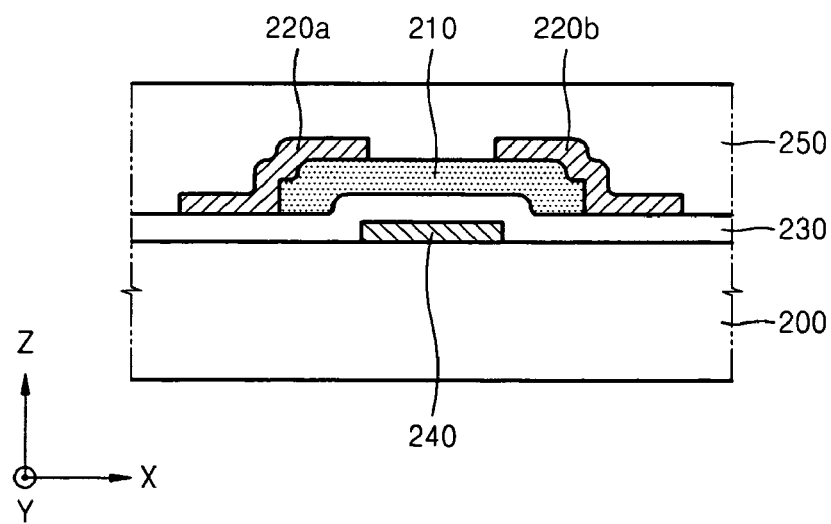

FIG. 2 is a cross-sectional view of a thin film transistor according to example embodiments. The thin film transistor may have a bottom gate structure in which a gate electrode 240 is formed below a channel layer 210. Referring to FIG. 2, the gate electrode 240 may be formed on a substrate 200, and a gate insulating layer 230 covering or on the gate electrode 240 may be formed on the substrate 200. A channel layer 210 may be formed on the gate insulating layer 230 above the gate electrode 240, and the channel layer 210 may be an IZO layer in which a transition metal is doped. The width of the channel layer 210 in an X direction may be greater than the width of the gate electrode 240 in the X direction.

A source electrode 220a and a drain electrode 220b may be formed on the gate insulating layer 230 contacting ends of the channel layer 210. A passivation layer 250 covering or on the source electrode 220a and the drain electrode 220b may be formed on the gate insulating layer 230. The materials and thicknesses of the substrate 200, the channel layer 210, the source electrode 220a, the drain electrode 220b, the gate insulating layer 230, the gate electrode 240, and the passivation layer 250 of FIG. 2, may be the same as those of the substrate 100, the channel layer 110, the source electrode 120a, the drain electrode 120b, the gate insulating layer 130, the gate electrode 140, and the passivation layer 150, respectively, of FIG. 1.

FIGS. 3A-3F are cross-sectional views illustrating a method of manufacturing the thin film transistor of FIG. 1, according to example embodiments. The method described below is to manufacture a thin film transistor having a top gate structure. Like reference numerals of the elements of FIGS. 3A-3F are used to indicate elements that are substantially identical to the elements of FIG. 1.

Figure 3A:
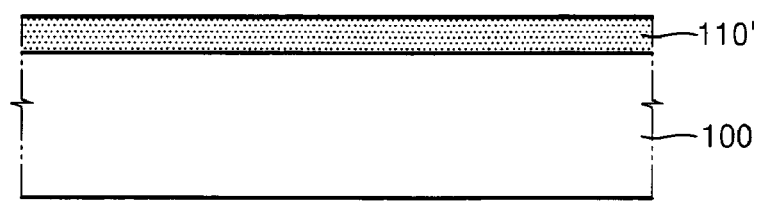
FIGS. 3A-3F and 4A-4D are cross-sectional views illustrating methods of manufacturing the thin film transistor of FIG. 1 and FIG. 2, respectively, according to example embodiments.

Referring to FIG. 3A, a semiconductor material layer 110' for forming a channel may be formed on the substrate 100, and the semiconductor material layer 110' may be an IZO layer in which a transition metal is doped. The transition metal may be at least one selected from the Group IX to XI elements, and the doping concentration of the transition metal may be about $10^3$ to about $10^{22}$ atom/cm$^3$. The semiconductor material layer 110' may be formed using a physical vapor deposition (PVD) method, e.g., a sputtering method and/or an evaporation method. At least one target may be used to form the semiconductor material layer 110', and the transition metal may be included in the target.

For example, the at least one target may include at least one of $In_2O_3$ and $Ga_2O_3$ and the transition metal. If the target does not include the transition metal, an undoped IZO layer may be formed on the substrate 100. The semiconductor material layer 110' may be formed by injecting ions of the transition metal into the undoped IZO layer. Therefore, the semiconductor material layer 110' may be an a($In_2O_3$).b(ZnO) layer in which the transition metal is doped, where a and b are real numbers such that a>about 0 and b>about 0, and may be real numbers such that about 0<a≦about 1 and b≧about 1.

Figure 3B:
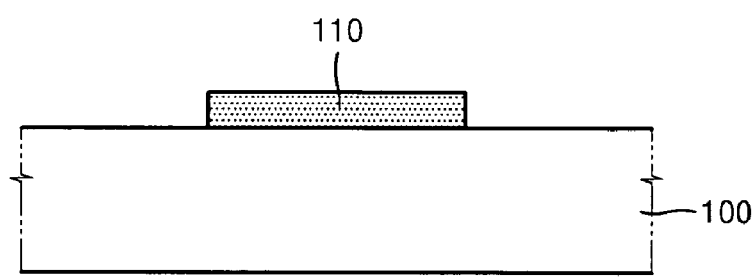
Figure 3C:
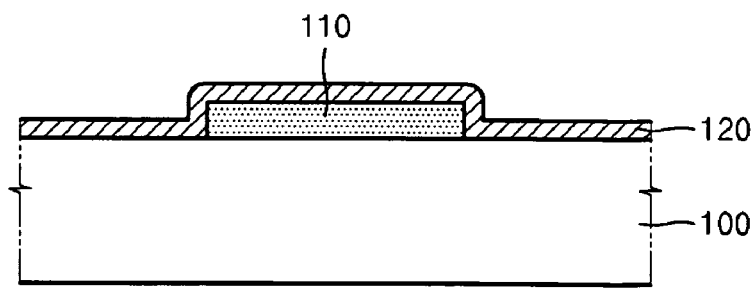

Referring to FIG. 3B, the channel layer 110 may be formed by patterning the semiconductor material layer 110'. Referring to FIG. 3C, a source/drain electrode layer 120 covering or on the channel layer 110 may be formed on the substrate 100, and the source/drain electrode layer 120 may be formed as a single metal layer or a multiple metal layer.

Figure 3D:
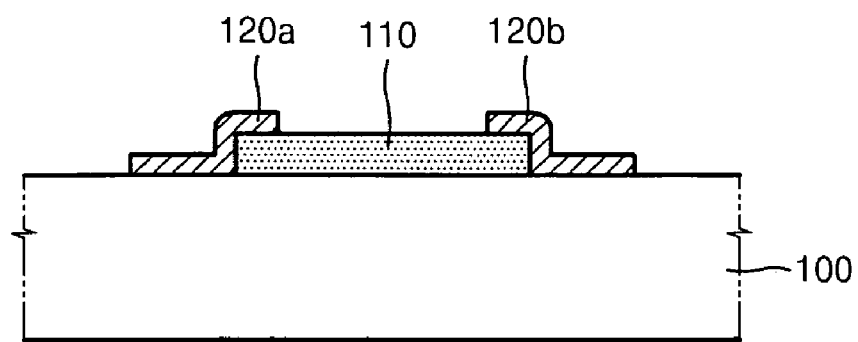

Referring to FIG. 3D, a portion of the upper surface of the channel layer 110 may be exposed and thus, the source electrode 120a and the drain electrode 120b contacting ends of the channel layer 110 may be formed by, for example, a dry etching of the source/drain electrode layer 120.

Figure 3E:
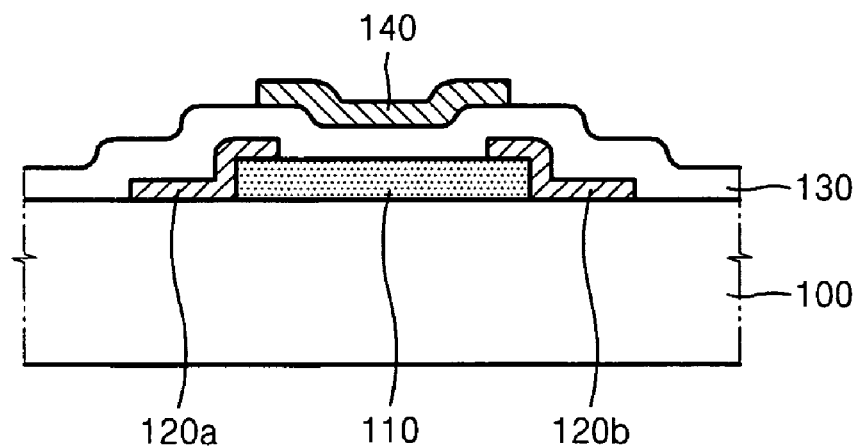

Referring to FIG. 3E, the gate insulating layer 130 covering or on the exposed portion of the channel layer 110 and the source electrode 120a and the drain electrode 120b may be formed on the substrate 100. The gate insulating layer 130 may be formed of a silicon oxide or a silicon nitride. The gate electrode 140 may be formed on the gate insulating layer 130 so that the gate electrode 140 is located above the channel layer 110. The gate electrode 140 may be formed of the same or different material used to form the source electrode 120a and the drain electrode 120b.

Figure 3F:
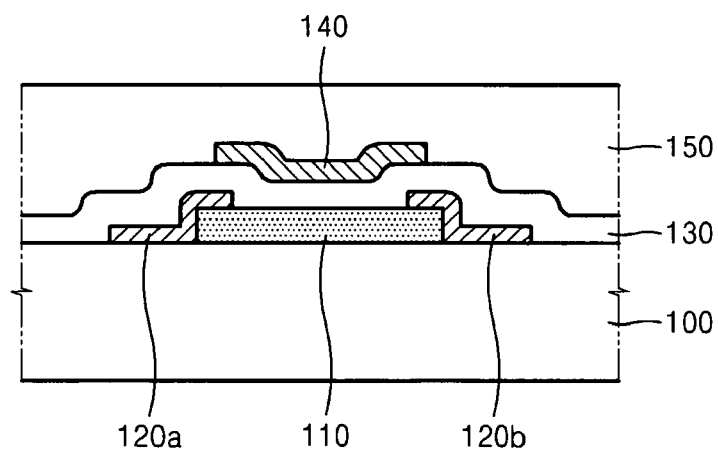

Referring to FIG. 3F, the passivation layer 150 covering or on the gate electrode 140 may be formed on the gate insulating layer 130. The passivation layer 150 may be formed of silicon oxide or silicon nitride. Thus, the thin film transistor formed according to the above method may be annealed at a predetermined or given temperature.

Figure 4A:
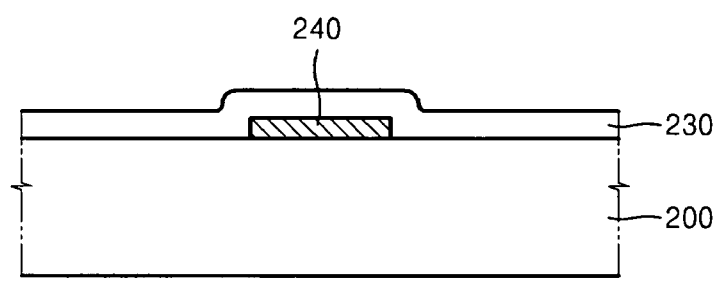

FIGS. 4A-4D are cross-sectional views illustrating a method of manufacturing a thin film transistor, according to example embodiments. The method described below is to manufacture a thin film transistor having a bottom gate structure. Like reference numerals in FIGS. 2 and 4A-4D substantially denote identical elements. Referring to FIG. 4A, the gate electrode 240 may be formed on the substrate 200, and the gate insulating layer 230 covering or on the gate electrode 240 may be formed on the substrate 200.

Figure 4B:
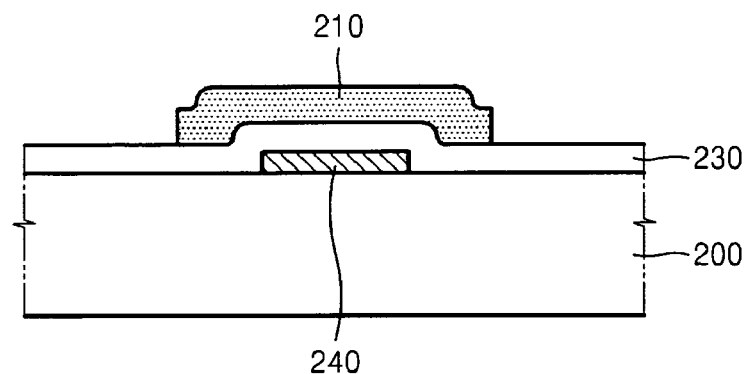
Figure 4C:
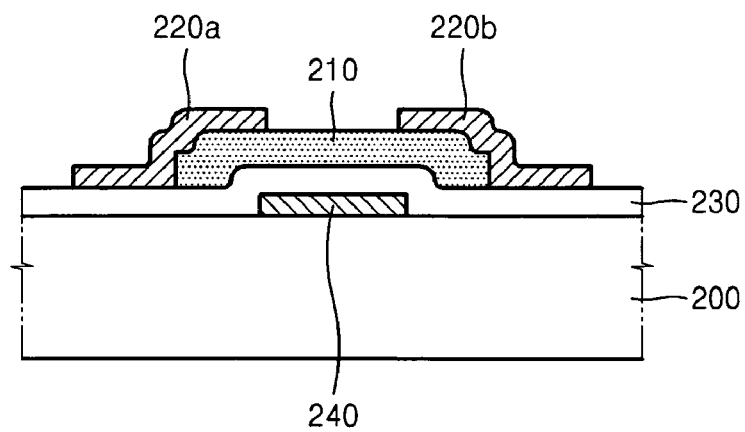
Figure 4D:
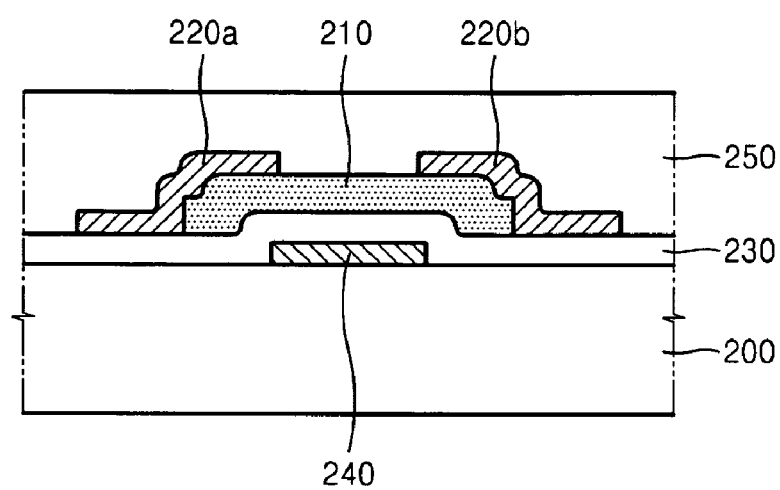

Referring to FIG. 4B, the channel layer 210 may be formed on the gate insulating layer 230 such that the channel layer 210 is located above the gate electrode 240. The channel layer 210 may be formed using the same method as the channel layer 110 described with reference to FIGS. 3A and 3B, and may be equivalent to the channel layer 210 of FIG. 2. Referring to FIG. 4C, the source electrode 220a and the drain electrode 220b, contacting ends of the channel layer 210, and exposing a portion of the top surface of the channel layer 210, may be formed on the gate insulating layer 230. Referring to FIG. 4D, the passivation layer 250 covering or on the exposed portion of the channel layer 210, the source electrode 220a, and the drain electrode 220b may be formed on the substrate 200.

Figure 5:
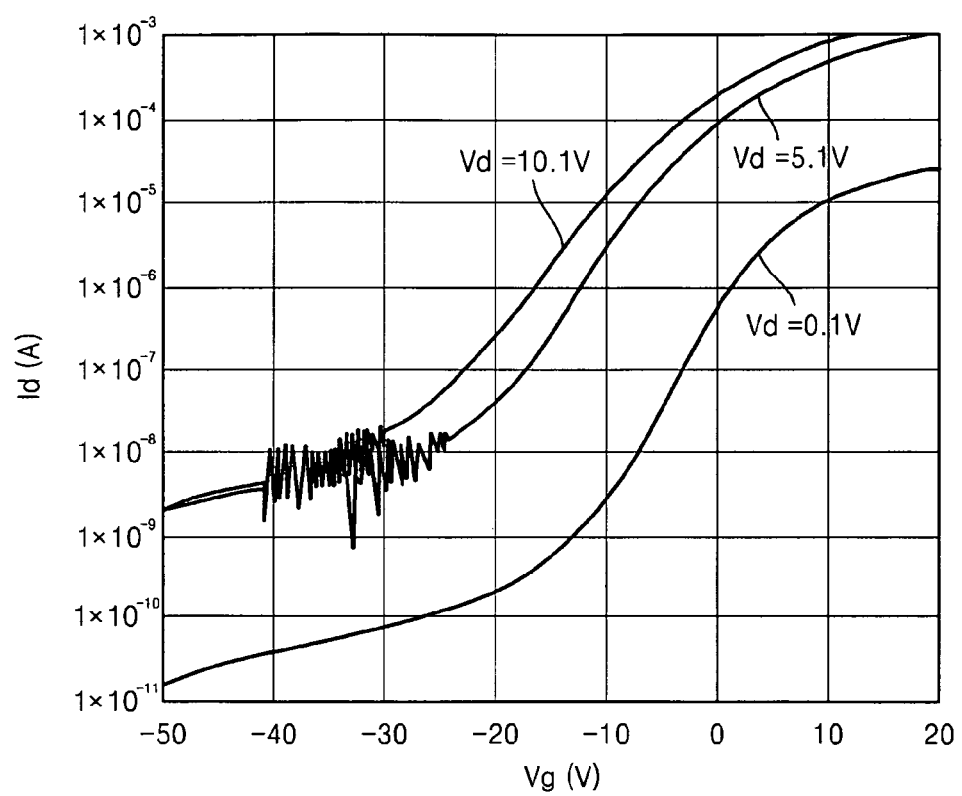

FIG. 5 is a graph showing the characteristics of drain current $I_d$ according to gate voltage $V_g$ for each drain voltage $V_d$ of the thin film transistor of FIG. 2, according to example embodiments. The graph of FIG. 5 is the result obtained of the thin film transistor that uses an IZO layer doped with Ni as the channel layer 210. Also, the content ratio of Zn, In, and Ni in the channel layer 210 may be Zn:In:Ni=about 1:about 1.0121:about 0.0079 (atomic ratio).

Figure 6:
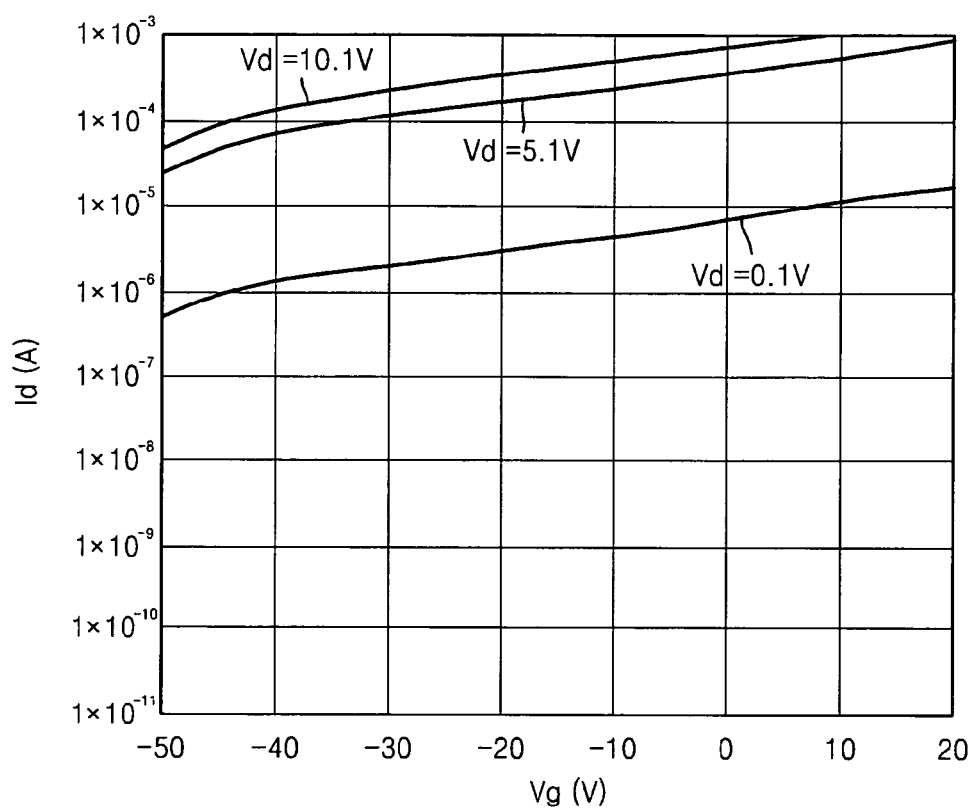

FIG. 6 is a graph showing the characteristics of drain current $I_d$ according to gate voltage $V_g$ for each drain voltage $V_d$ of a thin film transistor manufactured as a comparative example to compare with example embodiments. The graph of FIG. 6 is the result obtained of the thin film transistor that uses an undoped IZO layer as the channel layer. In the thin film transistor manufactured as the comparative example, the configuration may be identical to the configuration of the thin film transistor of FIG. 2 except the material used to form the channel layer 210.

Referring to FIGS. 5 and 6, the thin film transistor according to example embodiments may show switching characteristics even at a relatively high drain voltage $V_d$ of about 10.1V. However, the thin film transistor of the comparative example shows no switching characteristics at a relatively low drain voltage $V_d$ of about 0.1V because the transition metal doped in the channel layer 210 of the thin film transistor according to example embodiments may control the electrical conductivity of the channel layer 210. For example, the channel layer of the thin film transistor of the comparative example may include In (indium) having four valence electrons and may not include the transition metal.

Thus, the channel layer of the comparative example may have relatively increased electrical conductivity, and may not show switching characteristics for a gate voltage range. However, the channel layer 210 of the thin film transistor according to example embodiments may include the transition metal having less than four valence electrons, and thus, may have an appropriate electrical conductivity so as to have switching characteristics. Also, because the channel layer of the comparative example, for example, the undoped IZO layer, is relatively sensitive to light, employing the channel layer as a channel layer of a display apparatus may not be appropriate. However, the channel layers 110 and 210 of the thin film transistors doped with the transition metal may be relatively stable to light, thus, the channel layers 110 and 210 of the thin film transistors according to example embodiments may be appropriate to use as a channel layer of a display apparatus.

From the result of FIG. 5, an ON/OFF current ratio of the thin film transistor according to example embodiments may be as high as about $10^6$. Also, the thin film transistor according to example embodiments may have a mobility as high as about 30 cm²/Vs. Therefore, the thin film transistor according to example embodiments may have relatively high switching characteristics.

As described above, a thin film transistor according to example embodiments may have an IZO layer doped with a transition metal as a channel layer. Therefore, according to example embodiments, the thin film transistor having increased switching characteristics and increased operation speed may be realized.

While example embodiments have been particularly shown and described with reference to embodiments thereof, it should not be construed as being limited to the embodiments set forth herein but as an example. Those skilled in this art would know that example embodiments may be modified in various ways, for example, the constitute elements and structure of the thin film transistor. Also, the thin film transistor may be applied to not only liquid crystal display apparatuses or organic light emitting display apparatuses, but also memory devices and logic devices. Therefore, the scope of example embodiments is defined not by the detailed description of example embodiments, but defined by the appended claims.

What is claimed is:

1. A channel layer for a thin film transistor comprising IZO (indium zinc oxide) doped with a transition metal, wherein the transition metal is at least one selected from the group consisting of Co, Rh, Ir, Mt, Ni, Pd, Pt, Ds, Ag, Au, and Rg, and the channel layer has an electrical conductivity lower than that of an undoped IZO due to the transition metal.

2. The channel layer of claim 1, wherein the channel layer is made of a material expressed with an equation of $a(In_2O_3) \cdot b(ZnO)$, where a and b are real numbers such that a>about 0 and b>about 0.

3. The channel layer of claim 2, wherein a and b are real numbers such that about $0 < a \leq$ about 1 and $b \geq$ about 1.

4. The channel layer of claim 1, wherein the transition metal is Ni.

5. The channel layer of claim 1, wherein the doping concentration of the transition metal is about $10^3$~about $10^{22}$ atom/cm³.

6. A thin film transistor comprising:
a gate electrode and the channel layer according to claim 1 on a substrate;
a gate insulating layer between the gate electrode and the channel layer; and
a source electrode and a drain electrode which contact ends of the channel layer.

7. The thin film transistor of claim 6, wherein the gate electrode is above the channel layer.

8. The thin film transistor of claim 7, further comprising:
a passivation layer on the gate insulating layer and the gate electrode.

9. The thin film transistor of claim 6, wherein the gate electrode is below the channel layer.

10. The thin film transistor of claim 9, further comprising:
a passivation layer on the gate insulating layer, the channel layer, the source electrode and the drain electrode.

11. A method of forming a channel layer used in a thin film transistor comprising: providing a semiconductor material layer for forming a channel; and patterning the semiconductor material layer to form a channel layer,
wherein the semiconductor material layer is an IZO layer doped with a transition metal, the transition metal being at least one selected from the group consisting of Co, Rh, Ir, Mt, Ni, Pd, Pt, Ds, Ag, Au, and Rg, and the channel layer has an electrical conductivity lower than that of an undoped IZO due to the transition metal.

12. The method of claim 11, wherein the channel layer is formed of a material expressed with an equation of $a(In_2O_3) \cdot b(ZnO)$, where a and b are real numbers such that a>about 0 and b>about 0.

13. The method of claim 12, wherein a and b are real numbers such that about $0 < a \leq$ about 1 and $b \geq$ about 1.

14. The method of claim 11, wherein the transition metal is Ni.

15. The method of claim 11, wherein the doping concentration of the transition metal is about $10^3$~about $10^{22}$ atom/cm³.

16. A method of manufacturing a thin film transistor comprising:
forming the channel layer according to claim 11 on a substrate;
forming a source electrode and a drain electrode on the channel layer, wherein the source electrode and drain electrode contact ends of the channel layer;
forming a gate insulating layer on exposed portions of the channel layer and the source and drain electrode; and
forming a gate electrode on the gate insulating layer.

17. The method of claim 16, further comprising:
forming a passivation layer on the gate insulating layer and the gate electrode.

18. A method of manufacturing a thin film transistor comprising:
forming a gate electrode and a gate insulating layer on a substrate;
forming the channel layer according to claim 11 on the gate insulating layer; and
forming a source electrode and a drain electrode on the channel layer, wherein the source electrode and drain electrode contact ends of the channel layer.

19. The method of claim 18, further comprising:
forming a passivation layer on the gate insulating layer, the channel layer, the source electrode and the drain electrode.

20. A channel layer for a thin film transistor comprising IZO (indium zinc oxide), wherein the entire channel layer is doped with a transition metal, and the channel layer has an electrical conductivity lower than that of an undoped IZO due to the transition metal.

21. The channel layer of claim 20, wherein the transition metal is at least one selected from the elements of Group IX to XI.

22. The channel layer of claim 20, wherein the channel layer is made of a material expressed with an equation of $a(In_2O_3) \cdot b(ZnO)$, where a and b are real numbers such that a>about 0 and b>about 0.

23. A thin film transistor comprising:
a gate electrode and the channel layer according to claim 20 on a substrate;
a gate insulating layer between the gate electrode and the channel layer; and
a source electrode and a drain electrode which contact ends of the channel layer.

\* \* \* \* \*